United States Patent
Chatain et al.

(10) Patent No.: US 11,808,849 B2
(45) Date of Patent: Nov. 7, 2023

(54) ULTRASONIC MATRIX IMAGING DEVICE

(71) Applicant: MODULEUS, Tours (FR)

(72) Inventors: Pascal Chatain, Chambray-les-Tours (FR); Edgard Jeanne, Tours (FR)

(73) Assignee: MODULEUS, Tours (FR)

( * ) Notice: Subject to any disclaimer, the term of this patent is extended or adjusted under 35 U.S.C. 154(b) by 130 days.

(21) Appl. No.: 17/619,559

(22) PCT Filed: Jun. 16, 2020

(86) PCT No.: PCT/EP2020/066632
§ 371 (c)(1),
(2) Date: Dec. 15, 2021

(87) PCT Pub. No.: WO2020/254325
PCT Pub. Date: Dec. 24, 2020

(65) Prior Publication Data
US 2022/0413134 A1    Dec. 29, 2022

(30) Foreign Application Priority Data
Jun. 18, 2019   (FR) ..................... 1906515

(51) Int. Cl.
*G01S 15/00*    (2020.01)
*G01S 15/89*    (2006.01)

(52) U.S. Cl.
CPC ............... *G01S 15/8929* (2013.01)

(58) Field of Classification Search
USPC .......................................................... 367/7
See application file for complete search history.

(56) References Cited

U.S. PATENT DOCUMENTS

| | | | | |
|---|---|---|---|---|
| 5,060,651 A | * | 10/1991 | Kondo | A61B 8/4494 600/443 |
| 6,645,145 B1 | * | 11/2003 | Dreschel | A61B 8/4483 600/443 |
| 7,314,445 B2 | * | 1/2008 | Wodnicki | H04B 11/00 310/317 |
| 9,254,118 B2 | * | 2/2016 | Blalock | A61B 8/4483 |
| 11,325,153 B2 | * | 5/2022 | Chatain | H03F 3/45475 |

(Continued)

FOREIGN PATENT DOCUMENTS

| | | |
|---|---|---|
| FR | 3061616 A1 | 7/2018 |
| FR | 3063003 A1 | 8/2018 |
| WO | 99/49787 A1 | 10/1999 |

OTHER PUBLICATIONS

Authorized Officer: Nora Lindner, English translation of the Written Opinion of the International Searching Authority issued in PCT application No. PCT/EP2020/066632, dated Aug. 6, 2020, 6 pp.

(Continued)

*Primary Examiner* — James R Hulka
(74) *Attorney, Agent, or Firm* — KAPLAN BREYER SCHWARZ, LLP

(57) ABSTRACT

An ultrasound imaging device includes a plurality of ultrasound transducers arranged in an array of rows and columns. Each of the transducers has a first electrode and a second electrode. The first electrodes of the transducers of a same row are interconnected and the second electrodes of the transducers of a same column are interconnected.

11 Claims, 5 Drawing Sheets

(56) References Cited

U.S. PATENT DOCUMENTS

| | | | | |
|---|---|---|---|---|
| 2005/0154300 | A1* | 7/2005 | Wodnicki | B06B 1/0215 |
| | | | | 600/459 |
| 2008/0021324 | A1* | 1/2008 | Seto | G01S 15/8927 |
| | | | | 600/447 |
| 2011/0201936 | A1* | 8/2011 | Miyajima | G01S 7/52023 |
| | | | | 600/459 |
| 2014/0276075 | A1* | 9/2014 | Blalock | A61B 8/4483 |
| | | | | 600/459 |
| 2019/0337014 | A1* | 11/2019 | Chatain | H03K 19/018585 |

OTHER PUBLICATIONS

Authorized Officer: Kassner, Holger, International Search Report issued in counterpart PCT application No. PCT/EP2020/066632, dated Aug. 6, 2020, 4 pp.

Xiao Zhang et al., "A Fast-Switching (1.35-µs) Low-Control-Voltage (2.5-V) MEMS T/R Switch Monolithically Integrated With a Capacitive Micromachined Ultrasonic Transducer (CMUT)", "Journal of Microelectromechanical Systems", 29 pp., Apr. 2018, doi: 10.1109/JMEMS.2017.2781255.

* cited by examiner (A)

(B)

ULTRASONIC MATRIX IMAGING DEVICE

The present patent application claims the priority benefit of French patent application FR19/06515, which is herein incorporated by reference.

FIELD

The present disclosure concerns the field of ultrasound imaging, and more particularly aims at a device comprising an array of ultrasound transducers and an electronic circuit for controlling these transducers.

BACKGROUND

An ultrasound imaging device conventionally comprises a plurality of ultrasound transducers, and an electronic control circuit connected to the transducers. In operation, the transducer assembly is placed in front of a body, an image of which is desired to be acquired. The electronic device is configured to apply electric excitation signals to the transducers to cause the emission of ultrasound waves by the transducers, towards the body to be analyzed. The ultrasound waves emitted by the transducers are reflected by the body to be analyzed (by its internal and/or surface structure), and then return to the transducers, which convert them back into electric signals. The electric response signals are read by the electronic control circuit and may be stored and analyzed to deduce therefrom information relative to the studied body.

The ultrasound transducers may be arranged in a linear array in the case of two-dimensional image acquisition devices, or in an array in the case of three-dimensional image acquisition devices. In the case of a two-dimensional image acquisition device, the acquired image is representative of a cross-section of the studied body in a plane defined by the alignment axis of the transducers of the linear array on the one hand, and by the emission direction of the transducers on the other hand. In the case of a three-dimensional image acquisition device, the acquired image is representative of a volume defined by the two alignment directions of the transducers of the array and by the emission direction of the transducers.

Among three-dimensional image acquisition devices, devices called fully populated, where each transducer in the array is individually addressable, can be distinguished from devices called row-column addressing or RCA, where the transducers in the array are addressable by row and by column.

Fully populated devices provide a greater flexibility in the shaping of the ultrasound beams in transmit and in receive mode. The electronic system for controlling the array is however complex, the number of required transmit/receive channels being equal to M*N in the case of an array of M rows and M columns. Further, the signal-to-noise ratio is generally relatively low since each transducer has a smaller surface area of exposure to ultrasound waves.

RCA-type devices use algorithms for shaping the different ultrasound beams. The beam shaping possibilities may be decreased with respect to fully populated devices. However, the electronic systems for controlling the array are considerably simplified, the number of required transmit/receive channels being decreased to M+N in the case of an array of M rows and N columns. Further, the signal-to-noise is improved due to the interconnection of the transducers in a row or in a column during transmit and receive phases.

Row-column addressing (RCA) three-dimensional image acquisition devices are here more particularly considered.

SUMMARY

An object of an embodiment is to provide a three-dimensional ultrasound image acquisition device overcoming all or part of the disadvantages of known devices.

For this purpose, an embodiment provides an ultrasound imaging device, comprising:

a plurality of ultrasound transducers arranged in an array of rows and columns, each transducer comprising a first electrode and a second electrode, the first electrodes of the transducers of a same row being interconnected and the second electrodes of the transducers of a same column being interconnected;

for each row, a transmit circuit, a receive circuit, and a switch controllable to, in a first configuration, connect the first electrodes of the transducers in the row to the transmit circuit of the row, and, in a second configuration, connect the first electrodes of the transducers in the row to the receive circuit of the row;

for each column, a transmit circuit, a receive circuit, and a switch controllable to, in a first configuration, connect the second electrodes of the transducers in the column to the transmit circuit of the column and, in a second configuration, connect the second electrodes of the transducers in the column to the receive circuit of the column; and a control circuit configured to:

during a first transmit phase, control the switches of a row and of a column into the first configuration, control the transmit circuit of the row to apply a DC bias signal on the first electrodes of the transducers in the row, and control the transmit circuit of the column to apply a variable excitation signal on the second electrodes of the transducers in the column; and/or during a first receive phase, control the switches of a row and of a column respectively into the first configuration and into the second configuration, control the transmit circuit of the row to apply a DC bias signal on the first electrodes of the transducers in the row, and control the receive circuit of the column to read a variable response signal from the second electrodes of the transducers in the column.

According to an embodiment, the control circuit is further configured to:

during a second transmit phase, control the switches of a row and of a column into the first configuration, control the transmit circuit of the column to apply a DC bias signal on the second electrodes of the transducers in the column, and control the transmit circuit of the row to apply a variable excitation signal on the first electrodes of the transducers in the row; and/or during a second receive phase, control the switches of a row and of a column respectively into the second configuration and into the first configuration, control the transmit circuit of the column to apply a DC bias signal on the second electrodes of the transducers in the column, and control the receive circuit of the column to read a variable response signal from the first electrodes of the transducers in the row.

According to an embodiment:

in each row, the switch of the row is further controllable to, in a third configuration, connect the first electrodes of the transducers in the row to a node of application of a fixed bias potential; and in each column, the switch of the column is further controllable to, in a third configuration, connect the second electrodes of the transducers in the column to said node of application of a fixed bias potential.

According to an embodiment:
the switches of the different rows have common control terminals; and
the switches of the different columns have common control terminals.

According to an embodiment:
the switches of the different rows have differentiated control terminals; and
the switches of the different columns have differentiated control terminals.

According to an embodiment, the ultrasound transducers are CMUT transducers or PMUT transducers.

According to an embodiment, the switches are monolithically co-integrated with the array of ultrasound transducers.

According to an embodiment, each switch comprises first and second electrostatically-controlled MEMS interrupters.

According to an embodiment:
for each row, the first and second interrupters of the switch of the row are respectively arranged at the two ends of the row; and
for each column, the first and second interrupters of the switch of the column are respectively arranged at the two ends of the column.

According to an embodiment:
for each row, the first and second interrupters of the switch of the row are arranged on the side of a same end of the row; and
for each column, the first and second interrupters of the switch of the column are arranged on the side of a same end of the column.

According to an embodiment, each switch further comprises a third electrostatically-controlled MEMS interrupter, and:
for each row, the third interrupter of the switch of the row is arranged on the side of the same end of the row as the first interrupter in the row, or on the side of the end of the row opposite to the first interrupter in the row; and
for each column, the third interrupter of the switch of the column is arranged on the side of the same end of the column as the first interrupter in the column, or on the side of the end of the column opposite to the first interrupter in the column.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various possible applications of described imaging devices have not been detailed, the described embodiments being compatible with usual applications of ultrasonic imaging devices. Further, the properties (frequencies, shapes, amplitudes, etc.) of the electric excitation signals applied by the control circuit to the ultrasonic transducers have not been detailed, the described embodiments being compatible with the excitation signals currently used in ultrasonic imaging systems, which may be selected according to the considered application and in particular to the nature of the body to be analyzed and to the type of information which is desired to be acquired. Similarly, the various processings applied to the electric signals delivered by the ultrasonic transducers and read by the control circuit to extract useful information relative to the body to be analyzed have not been detailed, the described embodiments being compatible with processings currently used in ultrasonic imaging systems. Further, the forming of the ultrasound transducers and of the circuits for controlling the described imaging devices has not been detailed, the detailed forming of these elements being within the abilities of those skilled in the art based on the indications of the present description.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

Unless specified otherwise, the expressions "around", "approximately", "substantially" and "in the order of" signify within 10%, and preferably within 5%.

Figure 1:
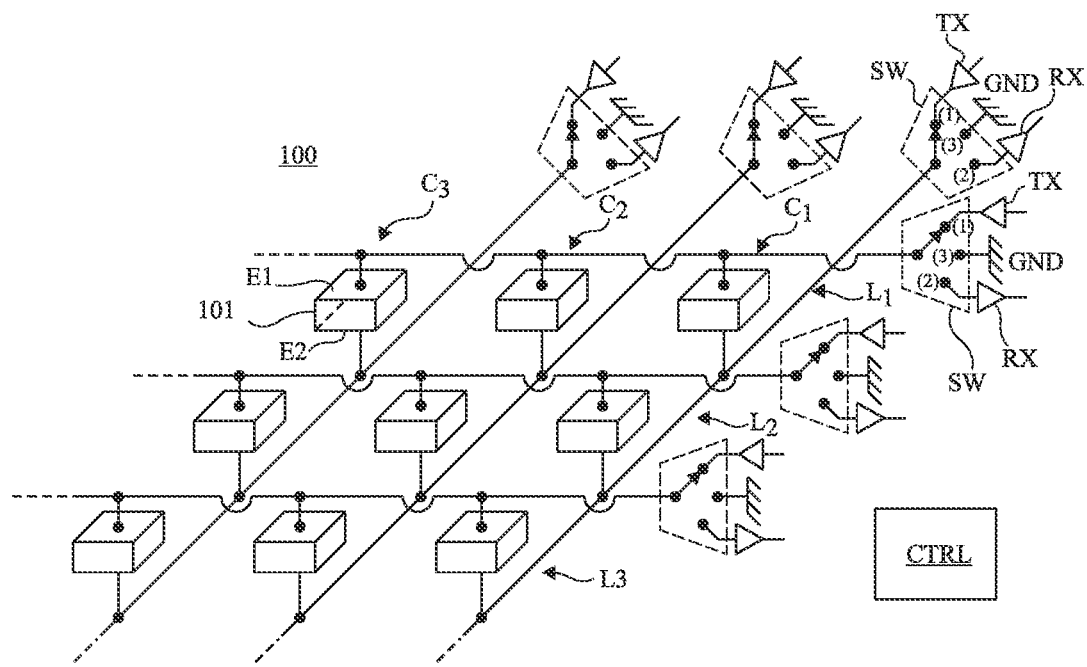
FIG. 1 is an electric diagram of an example of an array imaging device according to an embodiment.

FIG. 1 is an electric diagram of an example of an array imaging device 100 according to an embodiment.

Device 100 comprises a plurality of ultrasound transducers arranged in an array of M rows $L_i$ and N columns $C_j$, M and N being integers greater than or equal to two, i an integer in the range from 1 to M, and j an integer in the range from 1 to N.

Each transducer 101 comprises two electrodes E1 and E2. When an appropriate excitation voltage is applied between electrodes E1 and E2, the transducer emits an ultrasound acoustic wave. When the transducer receives an ultrasonic acoustic wave within a given wavelength range, it delivers between its electrodes E1 and E2 a voltage representative of the received wave.

In this example, transducers 101 are CMUT-type (capacitive membrane ultrasound transducer) transducers.

In each row $L_i$ of the array of transducers, the transducers 101 in the row have their respective electrodes E1 connected to one another. The electrodes E1 of transducers 101 of different rows are however not connected to one another. Further, in each column $C_j$ of the array of transducers, the transducers 101 in the column have their respective electrodes E2 connected to one another. The electrodes E2 of transducers 101 of different columns are however not connected to one another.

For each row $L_i$ of the transducer array, device 100 comprises a transmit circuit TX, a receive circuit RX, and a switch SW controllable to, in a first configuration (1), connect the electrodes E1 of the transducers in the row to an output terminal of the transmit circuit TX of the row and, in a second configuration (2), connect the electrodes E1 of the transducers in the row to an input terminal of the receive circuit RX of the row.

Further, for each column $C_j$ of the array of transducers, device 100 comprises a transmit circuit TX, a receive circuit RX, and a switch SW controllable to, in a first configuration (1), connect the electrodes E2 of the transducers in the column to an output terminal of the transmit circuit TX of the column, and, in a second configuration (2), connect the electrodes E2 of the transducers in the column to an input terminal of the receive circuit RX of the column.

For each row $L_i$, the switch SW of the row may further be controllable to, in a third configuration (3), connect the electrodes E1 of the transducers in the row to a node of application of a fixed bias potential GND, for example, the ground. Further, for each column $C_j$, the switch SW of the column may further be controllable to, in a third configuration (3), connect the electrodes E2 of the transducers in the row to node GND.

Device 100 further comprises a control circuit CTRL adapted to controlling switches SW and transmit circuits TX, and to reading the signals delivered by receive circuits RX. Control circuit CTRL forms, with the transmit TX and receive RX circuits and with switches SW, a circuit for controlling transducer array 101.

Each transmit circuit TX further comprises a pulse generator having an output terminal coupled, for example, connected, to the output terminal of circuit TX, and a control input terminal coupled, for example, connected, to an output terminal of control circuit CTRL. Each receive circuit RX may comprise an amplifier, preferably, a low-noise amplifier, having an input terminal coupled, for example, connected, to the input terminal of circuit RX, and an output terminal coupled, for example, connected, to an input terminal of control circuit CTRL.

To transmit and/or receive an ultrasound wave, a CMUT-type transducer generally has to be biased. For this purpose, a DC bias voltage is applied between its electrodes E1 and E2, while a variable (that is, non-continuous) excitation voltage is applied to one of its electrodes E1 and E2 or a variable response voltage is read from one of its electrodes E1 and E2.

In known ultrasound imaging devices, the bias voltage is delivered by a specific bias voltage, distinct from the transmit and receive circuits, and a decoupling capacitor is provided to isolate the bias circuit from the transmit and receive circuits. The provision of the bias circuit and of the decoupling capacitor however adds to the complexity and to the cost of the circuit for controlling the device. Further, the presence of the decoupling capacitor may cause parasitic couplings between the different transducers of the device. In particular, the presence of the decoupling capacitor significantly limits the possibilities of dynamic switching of the rows and columns, and accordingly the ability of the array to efficiently scan the two planes orthogonal to the propagation axis of ultrasound waves. This results in practice in an inhomogeneity in the reconstruction of the considered volume.

According to an aspect of an embodiment, in the device 100 of FIG. 1, the biasing of the ultrasound transducers is directly ensured by the transmit circuits TX of the control circuit. This enables to do away with a specific circuit for biasing transducers 101, and with a decoupling capacitor for isolating the bias circuit from the transmit RX and receive TX circuits.

During a phase of transmission of an ultrasound wave by means of a transducer 101 of device 100, control circuit CTRL controls the switches SW connected to the electrode E1 and to the electrode E2 of transducer 101 into the first configuration (1), to connect the electrodes E1 and E2 of transducer 101 respectively to the transmit circuit TX of the row $L_i$ to which the transducer belongs, and to the transmit circuit TX of the column $C_j$ to which transducer 101 belongs. Control circuit CTRL then controls the transmit circuit TX of the row $L_i$ to which the transducer belongs to apply a DC bias voltage to the electrode E1 of the transducer, and simultaneously controls the transmit circuit TX of the column $C_j$ to which the transducer belongs to apply a variable excitation voltage, for example, an AC voltage, on the electrode E2 of the transducer.

During a phase of reception of an ultrasound wave by means of a transducer 101 of device 100, control circuit CTRL controls the switches SW connected to the electrode E1 and to the electrode E2 of transducer 101 respectively into the first configuration (1) and into the second configuration (2), to connect the electrodes E1 and E2 of transducer 101 respectively to the transmit circuit TX of the row $L_i$ to which the transducer belongs, and to the receive circuit RX of the column $C_j$ to which transducer 101 belongs. Control circuit CTRL then controls the transmit circuit TX of the row $L_i$ to which the transducer belongs to apply a DC bias voltage to the electrode E1 of the transducer, and simultaneously controls the reception circuit RX of the column $C_j$ to which the transducer belongs to read an AC response voltage from electrode E2 of the transducer.

As a variant, the DC bias voltage may be applied to electrode E2, the variable excitation voltage and the variable response voltage then being respectively applied to and read from electrode E1.

In another variant, the DC bias voltage may be applied on one of electrodes E1 and E2 during the transmit phase, and then on the other electrode during the receive phase. As an example, during the transmit phase, the DC bias voltage is applied on electrode E1 and the variable excitation voltage is applied on electrode E2 and, during the receive phase, the DC bias voltage is applied on electrode E2 and the variable response voltage is read from electrode E1.

Figure 2:
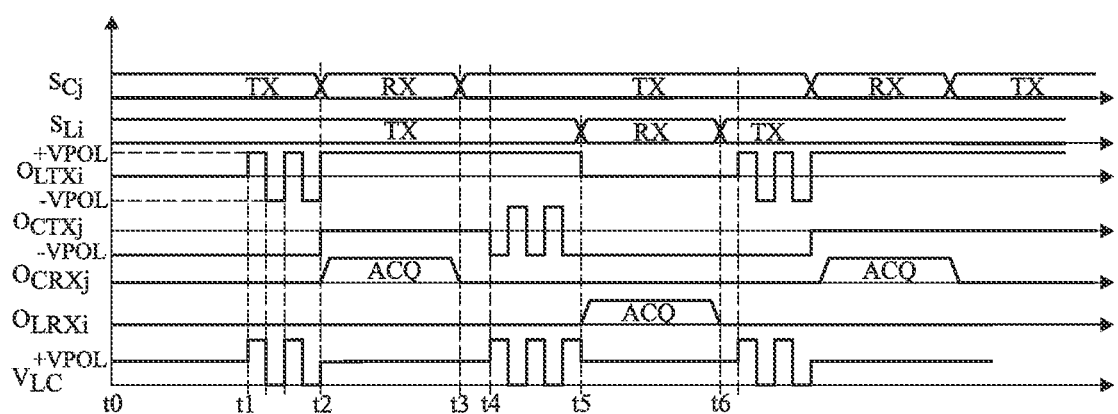
FIG. 2 is a timing diagram illustrating an example of a method of controlling the device of FIG. 1.

FIG. 2 is a timing diagram schematically illustrating an example of a method of controlling the device 100 of FIG. 1, capable of being implemented by control circuit CTRL. A row $L_i$ and a column $C_j$ of the array of transducers 101 are more particularly considered in this example. FIG. 2 shows the time variation of a signal $S_{Cj}$ for controlling the switch SW of column $C_j$, of a signal $S_{Li}$ for controlling the switch SW of row $L_i$, of the voltage $O_{LTXi}$ delivered by the transmit circuit TX of row $L_i$, of the voltage $O_{CTXj}$ delivered by the transmit circuit TX of column $C_j$, of the voltage $O_{CRXj}$ delivered by the receive circuit RX of column $C_j$, of the voltage $O_{LRXi}$ delivered by the receive circuit RX of row $L_i$, and of the voltage $V_{LC}$ between the electrodes E1 of the transducers of row $L_i$ and the electrodes E2 of the transducers of column $C_j$. It should be noted that, for simplification, signals $S_{Cj}$ and $S_{Li}$ are not detailed in FIG. 2. More particularly, for each of signals $S_{Cj}$ and $S_{Li}$, only a state 'TX' corresponding to a state of control of switch SW to the first configuration (connection to transmit circuit TX), and a state 'RX' corresponding to a state of control of switch SW to the second configuration (connection to receive circuit RX) have been shown. Further, for simplification, the response signals $O_{CRXj}$ and $O_{LRXi}$ delivered by receive circuits RX during receive phases are not detailed in FIG. 2. More particularly, for each of signals $O_{CRXj}$ and $O_{LRXi}$, a state 'ACQ' corresponding to the delivery of a variable signal by circuit RX during a phase of reception of an ultrasound wave has simply been shown.

From time t0 and until a time t1 subsequent to time t0, the switch SW of column $C_j$ and the switch SW of row $L_i$ are both controlled to the first configuration (TX), to connect the electrodes E1 of the transducers of row $L_i$ to the transmit circuit TX of row $L_i$, and the electrodes E2 of the transducers of column $C_j$ to the transmit circuit TX of column $C_j$. The transmit circuit TX of row $L_i$ is controlled to apply a substantially zero DC voltage $O_{LTXi}$ on the electrodes E1 of the transducers of row $L_i$, and the transmit circuit TX of column $C_j$ is controlled to apply a negative DC bias voltage $O_{CTXj}$–$V_{POL}$, for example, in the order of −10 volts, on the electrodes E2 of the transducers of column $C_j$. Voltage $V_{LC}$ then is a positive DC voltage equal to +$V_{POL}$. In the absence of a connection of receive circuits RX to electrodes E1 and E2, the voltages $O_{CRXj}$ and $O_{LRXi}$ respectively delivered by the receive circuit RX of column $C_j$ and by the receive circuit of row $L_i$ have substantially zero values.

From time t1 and until a time t2 subsequent to time t1, control circuit CTRL controls the transmit circuit TX of row $L_i$ to apply a variable excitation signal, for example, a series of positive and/or negative voltage pulses, to the electrodes E1 of the transducers 101 of row $L_i$. In the shown example, the excitation signal corresponds to an alternation of positive square voltage pulses of value $V_{POL}$ and of negative square voltage pulses of value –$V_{POL}$. Voltage $V_{LC}$ thus is a square pulse voltage alternating between 0 volt and 2*$V_{POL}$.

Times t1 and t2 respectively mark the beginning and the end of a phase of transmission of an ultrasound wave by the transducer 101 common to row $L_i$ and to column $C_j$. In practice, DC bias voltage –$V_{POL}$ may also be applied to the electrodes E2 of the transducers 101 of the other columns of the device. In this case, during the transmit phase ranging from time t1 to time t2, an ultrasound wave is transmitted by all the transducers 101 of row $L_i$.

From time t2 and until a time t3 subsequent to time t2, the switch SW of column $C_j$ is controlled into the second configuration (RX), to connect the electrodes E2 of the transducers in column $C_j$ to the receive circuit RX of the column. The switch SW of row $L_i$ is maintained in the first configuration (TX). The transmit circuit TX of row $L_i$ is controlled to apply a positive DC voltage $O_{LTXi}$+$V_{POL}$ to the electrodes E1 of the transducers of row $L_i$. Neglecting the oscillations due to the reception of the return ultrasound wave by the transducers (in practice, the amplitude of the return signal originating from the acoustic-to-electric conversion is smaller by at least four orders of magnitude than the amplitude of the excitation signal, that is, 80 dB smaller), voltage $V_{LC}$ then is a positive DC voltage equal to +$V_{POL}$.

Times t2 and t3 respectively mark the beginning and the end of a phase of reception of a return ultrasound wave by the transducer 101 common to row $L_i$ and to column $C_j$. During the receive phase, the voltage $O_{CRXj}$ delivered by the receive circuit RX of column $C_j$ is representative of the ultrasound wave received by the transducer 101 common to row $L_i$ and to column $C_j$. Voltage $O_{CRXj}$ may be read by control circuit CTRL. In practice, during the receive phase, DC bias voltage $V_{POL}$ may also be applied to the electrodes E1 of the transducers 101 of the other rows of the device. In this case, voltage $O_{CRXj}$ is representative of the return ultrasound wave received by all the transducers 101 of column $C_j$.

FIG. 2 further shows, after time t3, a second example of implementation of phases of transmission and reception of ultrasound waves by device 100. In this second example, the electrodes of application of the DC bias voltages and the electrodes of application of the excitation signals and of reading of the return signals are inverted with respect to the example which has just been described.

From time t3 and until a time t4 subsequent to time t3, the switch SW of column $C_j$ and the switch SW of line $L_i$ are both controlled to the first configuration (TX). The transmit circuit TX of column $C_j$ is controlled to apply a substantially zero DC voltage $O_{CTXj}$ on the electrodes E2 of the transducers of column $C_j$, and the transmit circuit TX of row $L_i$ is controlled to apply a positive DC bias voltage $O_{LTXi}$+$V_{POL}$ on the electrodes E1 of the transducers of row $L_i$. Voltage $V_{LC}$ then is a positive DC voltage equal to +$V_{POL}$.

From time t4 and until a time t5 subsequent to time t4, control circuit CTRL controls the transmit circuit TX of column $C_j$ to apply a variable excitation signal on the electrodes E2 of the transducers 101 of column $C_j$.

Times t4 and t5 respectively mark the beginning and the end of a phase of transmission of an ultrasound wave by the transducer 101 common to row $L_i$ and to column $C_j$. In practice, DC bias voltage +$V_{POL}$ may also be applied to the electrodes E1 of the transducers 101 of the other rows of the device. In this case, during the transmit phase lasting from time t4 to time t5, an ultrasound wave is transmitted by all the transducers 101 of column $C_j$.

From time t5 and until a time t6 subsequent to time t5, the switch SW of row $L_i$ is controlled to the second configuration (RX), to connect the electrodes E1 of the transducers of row $L_i$ to the receive circuit RX of the row. The switch SW of column $C_j$ is maintained in the first configuration (TX). The transmit circuit TX of column $C_j$ is controlled to apply a DC negative voltage $O_{CTXj}$–$V_{POL}$ on the electrodes E2 of the transducers of column $C_j$. Neglecting the oscillations due to the reception of the return ultrasound wave, voltage $V_{LC}$ then is a positive DC voltage equal to +$V_{POL}$.

Times t5 and t6 respectively mark the beginning and the end of a phase of reception of a return ultrasound wave by the transducer 101 common to row $L_i$ and to column $C_j$. During the receive phase, the voltage $O_{LRXi}$ delivered by the receive circuit RX of row $L_i$ is representative of the ultrasound wave received by the transducer 101 common to row $L_i$ and to column $C_j$. Voltage $O_{LRXi}$ can be read by control circuit CTRL. In practice, during the receive phase, DC bias voltage –$V_{POL}$ may also be applied to the electrodes E2 of the transducers 101 of the other columns of the device. In this case, voltage $O_{LRXi}$ is representative of the return ultrasound wave received by all the transducers 101 of column $L_i$.

In the example of FIG. 2, from time t6, the method carries on with a new transmit-receive phase similar to that implemented from time t0.

In the example of FIG. 1, the third configuration (3) of switches SW may further enable to control the array of transducers 101 as a linear array of transducers, to acquire a two-dimensional image. For this purpose, the switches SW of all the rows $L_i$ of the array may for example be controlled to the third configuration, to apply a same DC bias potential GND to the electrodes E1 of all the transducers. Each column $C_j$ of the array then behaves as a single transducer alternately controlled in transmit mode (the switch SW of the column then being in the first configuration) and in receive mode (the switch of the column then being in the second configuration). It should be noted that node GND is not necessarily connected to ground but may be coupled to a terminal for delivering a fixed bias potential adapted for the biasing of the transducers.

Similarly, the switches SW of all the columns $C_j$ of the array may be controlled to the third configuration. Each row of the array then behaves as a single transducer alternately controlled in transmit and in receive mode.

As a variant, the third configuration (3) of switches SW may be used in array mode (acquisition of a three-dimensional image) to apply to the transducers bias voltages different from the levels defined by the high and low values of the voltages delivered by transmit circuits TX.

In the example of FIG. 1, each switch SW for example comprises first, second, and third interrupters, each having a first conduction node connected to the electrodes E1 of the corresponding rows or to the electrodes E2 of the corresponding column, and a second conduction node respectively connected to the output terminal of the transmit circuit TX of the corresponding row or column, to the input terminal of the receive circuit RX of the corresponding row or column, and to node GND.

As a variant, the third configuration of switches SW may be omitted, which enables to simplify their forming.

The interrupters of switches SW may be formed by means of transistors, for example, MOS transistors. In this case, the switches are for example integrated in a semiconductor chip distinct from the substrate inside and on top of which transducers 101 are formed. As an example, the transmit RX and receive TX circuits, control circuit CTRL, and switches SW are integrated in a same semiconductor chip.

In a preferred embodiment, the interrupters of switches SW are formed in MEMS ("Micro Electro Mechanical System") technology. Switches SW are then preferably monolithically integrated with the array of ultrasound transducers, for example such as described in the article entitled "A Fast-Switching (1.35-µs) Low-Control-Voltage (2.5-V) MEMS T/R Switch Monolithically Integrated With a Capacitive Micromachined Ultrasonic Transducer" of Xiao Zhang et al. (Journal of Microelectromechanical Systems PP(99):1-11 Jan. 2018).

Figure 3:
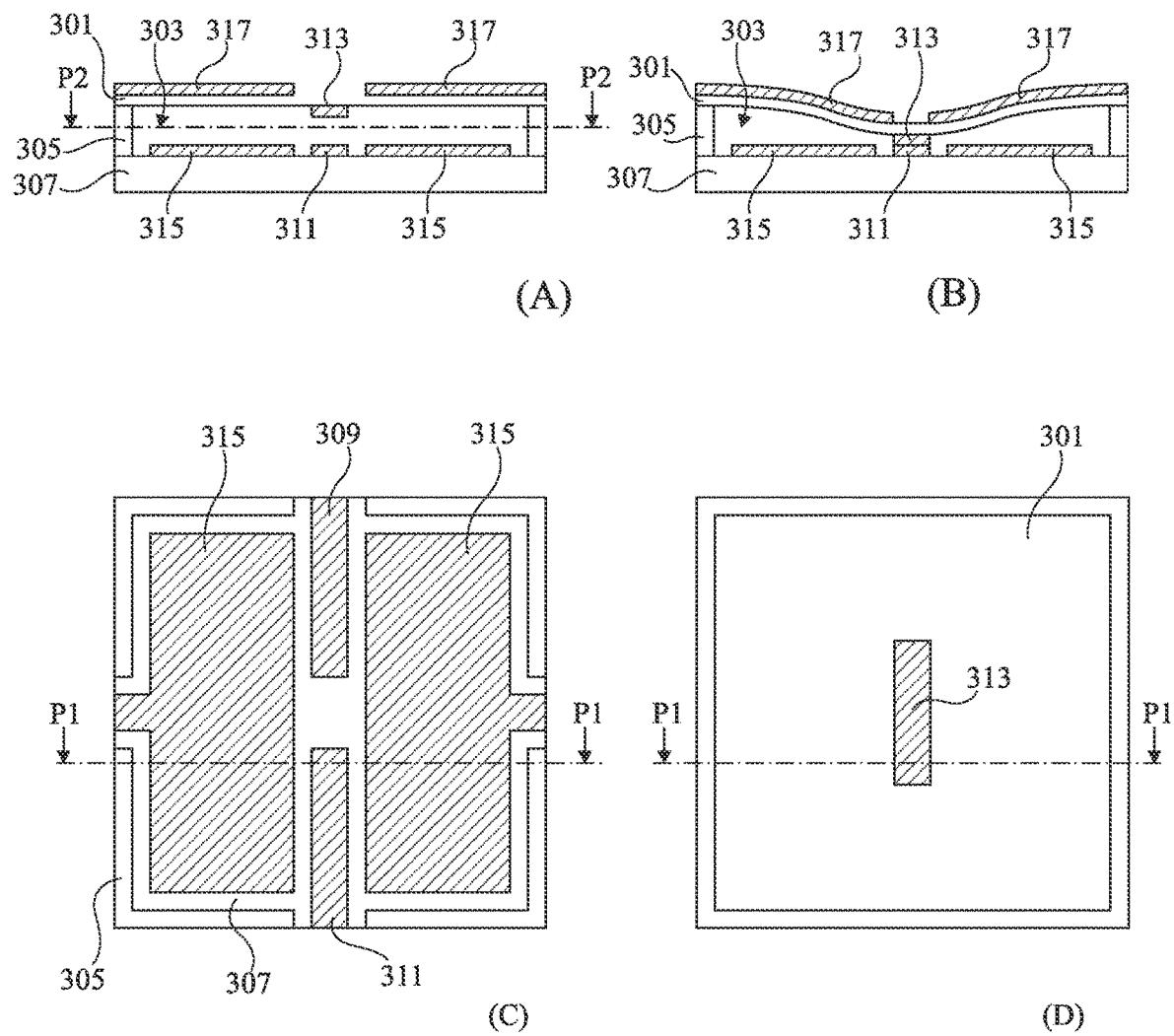
FIG. 3 illustrates an example of embodiment of a switch of the device of FIG. 1.

FIG. 3 schematically shows an example of embodiment of such an interrupter. FIG. 3 more particularly shows two side cross-section views (A) and (B) of the interrupter respectively in the off (blocked) state and in the on (conductive) state as well as a top cross-section view (C) and a bottom cross-section view (D) of the interrupter. Views (A) and (B) are cross-section views along plane P1 of views (C) and (D), and views (C) and (D) are cross-sections views along plane P2 of view (A).

The interrupter of FIG. 3 comprises a flexible membrane 301 suspended above a cavity 303 formed in a rigid support layer 305. Layer 305, for example, made of silicon oxide, is arranged on the upper surface of a support substrate 307, for example, made of glass. In the shown example, cavity 303 is through, that is, the bottom of the cavity is formed by the upper surface of substrate 307.

The interrupter of FIG. 3 comprises, arranged on top of and in contact with the bottom of cavity 303, two separate metallizations 309 and 311, forming the two main conduction terminals of the interrupter. The interrupter of FIG. 3 further comprises, arranged on top of and in contact with the lower surface of membrane 301, a coupling metallization 313 arranged so that, when membrane 301 is in a first position called high position, corresponding to the view (A) of FIG. 3, metallization 313 is not in contact with metallizations 309 and 311 and, when membrane 301 is in a second position called low position, corresponding to the view (B) of FIG. 3, metallization 313 connects metallizations 309 and 311 to each other. Thus, in the high position of membrane 301, the interrupter is in the off state and, in the low position of membrane 301, the interrupter is in the on state.

The interrupter comprises a first control electrode arranged on top of and in contact with the bottom of cavity 303 and electrically insulated from metallizations 309 and 311, and a second control electrode 317 arranged on top of and in contact with the upper surface of membrane 301 and electrically insulated from coupling metallization 313.

The application of an appropriate control voltage between electrodes 315 and 317 results in placing the membrane in the low position by electrostatic effect, and thus in turning on the interrupter. In the absence of a voltage between electrodes 315 and 317, the membranes returns to its high position, causing the turning off of the interrupter.

Flexible membrane 301 may be made of silicon and/or of silicon oxide. Preferably, membrane 301 comprises at least one insulating layer, for example, made of silicon oxide, ensuring an electric insulation on the one hand between upper control electrode 317 and metallization 313, and on the other hand between upper control electrode 317 and lower control electrode 315. As an example, flexible membrane 301 comprises a stack (not detailed in the drawing) of a silicon layer and of an insulating layer, for example, made of silicon oxide, coating the lower surface of the silicon layer.

Further, to avoid any disturbance of the signal transmitted between metallizations 309 and 311 through metallization 313, upper control electrode 317 is preferably interrupted opposite metallizations 309, 311, and 313.

Figure 4:
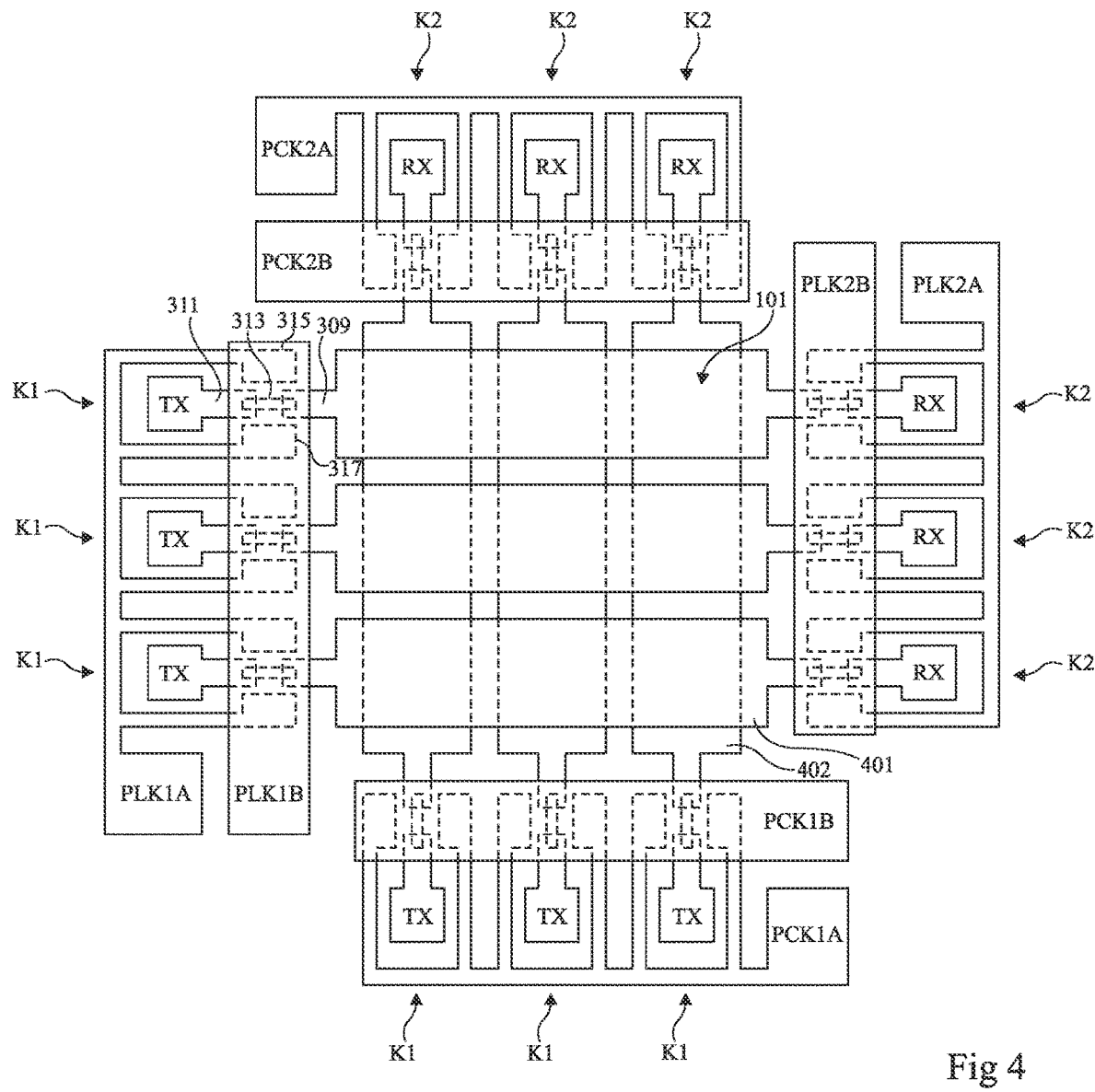
FIG. 4 schematically and partially shows a first example of embodiment of the device of FIG. 1.

FIG. 4 is a top view schematically illustrating an example of co-integration, in monolithic form on a same support substrate 307 (not visible in FIG. 4), of the array of ultrasound transducers 101 and of the switches SW of the device 100 of FIG. 1. As an example, the transmit RX and receive TX circuits and control circuit CTRL (not visible in FIG. 4) are integrated in one or a plurality of semiconductor chips distinct from the monolithic chip integrating transducers 101 and switches SW.

In this example, for simplification, an array of 3*3 ultrasound transducers 101 has been considered.

Each transducer has a structure similar to that of the switch of FIG. 3, with the difference that, in transducers 101, conduction metallizations 309 and 311 and coupling metallization 313 are not present. In each transducer 101, low 315 and upper 317 control electrodes respectively correspond to the electrodes E2 and E1 of FIG. 1.

In the example of FIG. 4, in each row $L_i$ of the array of transducers, the upper control electrodes of the transducers 101 in the row, corresponding to electrodes E1, are connected to one another and form a continuous metal strip 401 extending along substantially the entire length of the row. Further, in each column $C_j$ of the array of transducers, the lower control electrodes of the transducers 101 in the row, corresponding to electrodes E2, are connected to one another and form a continuous metal strip 402 extending along substantially the entire length of the column. In this example, metal strips 401 are parallel to one another, and metal strips 402 are parallel to one another, and perpendicular to strips 401.

In the example of FIG. 4, for each row $L_i$ of the array of transducers, the device comprises a first interrupter K1 arranged at a first end of the metal strip 401 of the row, and a second interrupter K2 arranged at the opposite end of the metal strip 401 of the row. Interrupters K1 and K2 are MEMS interrupters of the type described in relation with FIG. 3. Each of interrupters K1 and K2 has its conduction metallization 309 connected to metal strip 401. The conduction metallization 311 of interrupter K1 is connected to a metal pad TX intended to be connected to the output terminal of the transmit circuit TX of the row. The conduction metallization 311 of interrupter K2 is connected to a metal pad RX intended to be connected to the input terminal of the receive circuit RX of the row.

In the example of FIG. 4, the device further comprises, for each column $C_j$ of the array of transducers, a first interrupter K1 arranged at a first end of the metal strip 402 of the column, and a second interrupter K2 arranged at the opposite end of the metal strip 402 of the column. Each of interrupters K1 and K2 has its conduction metallization 309 connected to metal strip 402. The conduction metallization 311 of interrupter K1 is connected to a metal pad TX intended to be connected to the output terminal of the transmit circuit TX of the column. The conduction metallization 311 of interrupter K2 is connected to a metal pad RX intended to be connected to the input terminal of the receive circuit RX of the column.

For each row $L_i$, the interrupters K1 and K2 of the row form the switch SW of the row. Similarly, for each column $C_j$, the interrupters K1 and K2 of the column form the switch SW of the column. In this example, switches SW are switches with two positions, only controllable to the first (1) and second (2) configurations.

In the example of FIG. 4, the interrupters K1 of the different rows $L_i$ of the array are all located on the side of a same edge of the array, the left-hand edge in the shown example, and the interrupters K2 of the different rows $L_i$ of the array are all located on the side of the opposite edge of the array, the right-hand edge in the shown example. Further, in this example, the interrupters K1 of the different columns $C_j$ of the array are all located on the side of a same edge of the array, the lower edge in the shown example, and the interrupters K2 of the different columns $C_j$ of the array are all located on the side of the opposite edge of the array, the upper edge in the shown example.

In the example of FIG. 4:

the control electrodes 315 of the interrupters K1 of the different rows $L_i$ of the array are all connected to a same metal pad PLK1A and the control electrodes 317 of the interrupters K1 of the different rows $L_i$ of the array are all connected to a same metal pad PLK1B;

the control electrodes 315 of the interrupters K2 of the different rows $L_i$ of the array are all connected to a same metal pad PLK2A and the control electrodes 317 of the interrupters K2 of the different rows $L_i$ of the array are all connected to a same metal pad PLK2B;

the control electrodes 315 of the interrupters K1 of the different columns $C_j$ of the array are all connected to a same metal pad PCK1A and the control electrodes 317 of the interrupters K1 of the different columns $C_j$ of the array are all connected to a same metal pad PCK1B; and the control electrodes 315 of the interrupters K2 of the different columns $C_j$ of the array are all connected to a same metal pad PCK2A and the control electrodes 317 of the interrupters K2 of the different columns $C_j$ of the array are all connected to a same metal pad PCK2B.

Metal pads PLK1A, PLK1B, PLK2A, PLK2B, PCK1A, PCK1B, PCK2A, PCK2B are intended to be connected to the device control circuit CTRL.

In this example, the interrupters K1 of the different rows $L_i$ are all simultaneously controlled by application of an appropriate control voltage between pads PLK1A and PLK1B. Further, the interrupters K2 of the different rows $L_i$ are all simultaneously controlled by application of an appropriate control voltage between pads PLK2A and PLK2B. Further, the interrupters K1 of the different rows $L_i$ are all simultaneously controlled by application of an appropriate control voltage between pads PCK2A and PCK1B. Further, the interrupters K2 of the different columns $C_j$ are all simultaneously controlled by application of an appropriate control voltage between pads PCK2A and PCK2B. This enables to limit the number of connection pads necessary to control switches SW, and thus to limit the general bulk and the cost of the device.

Figure 5:
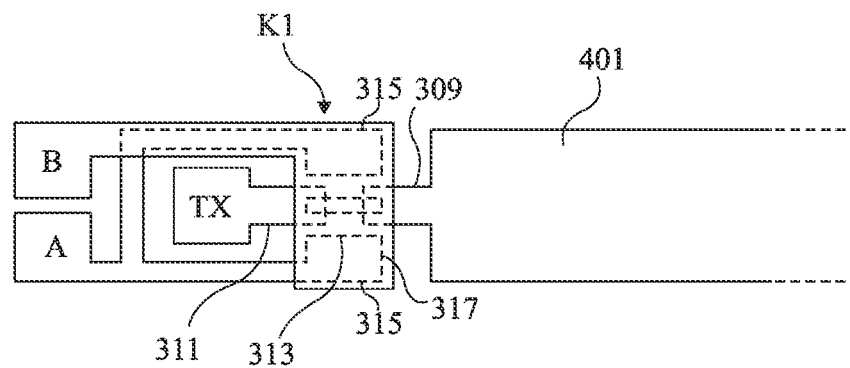
FIG. 5 schematically and partially shows a second example of embodiment of the device of FIG. 1.

FIG. 5 illustrates an alternative embodiment of the device of FIG. 4.

In the variant of FIG. 5, two specific metal conduction pads A and B are provided for each of the interrupters K1 and K2 of the device, pads A and B being respectively connected to the lower control electrode 315 and to the upper control electrode 317 of the interrupter. This enables to individually control interrupters K1 and K2.

For simplification, only a single interrupter K1 and a portion of metal strip 401 connected to this interrupter are shown in FIG. 5.

Figure 6:
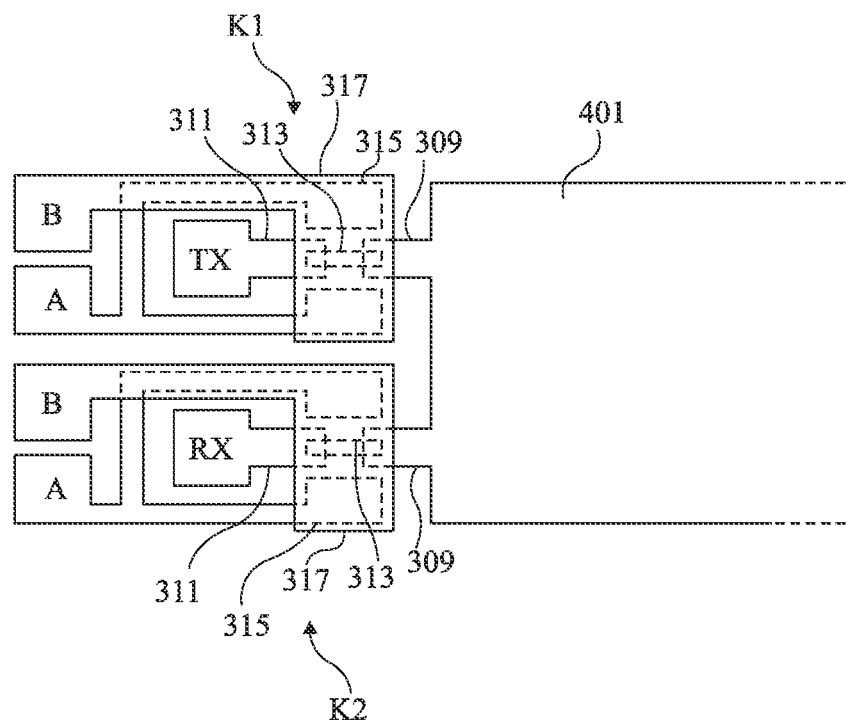
FIG. 6 schematically and partially shows a third example of embodiment of the device of FIG. 1.

FIG. 6 illustrates another alternative embodiment of the device of FIG. 4. In the example of FIG. 6, for each row $L_i$ of the device, the interrupters K1 and K2 of the row are arranged on the side of a same end of row $L_i$. Similarly, for each column $C_j$ of the device, the interrupters K1 and K2 of the column may be arranged on the side of a same end of the column.

In the example of FIG. 6, as well as in the example of FIG. 5, two specific metal conduction pads A and B are provided for each of the interrupters K1 and K2 of the device. As a variant, the respective control electrodes of the interrupters K1 and K2 of the different rows, and the respective control electrodes of the interrupters K1 and K2 of the different columns may be interconnected similarly to what has been described in relation with FIG. 4, to decrease the total number of connection pads of the device.

For simplification, only a single interrupter K1, a single interrupter K2, and a portion of metal strip 401 connected to these interrupters are shown in FIG. 6.

In the case where switches SW each comprise three interrupters, the three interrupters may be arranged on the side of a same end of the corresponding metal strip 401 or 402. As a variant, two of the interrupters may be arranged on the side of a same end of the corresponding metal strip 401 or 402, the third switch being arranged on the side of the opposite end of the metal strip. As in the example of FIG. 5, two specific metal conduction pads A and B may be provided for each of the interrupters. As a variant, the respective electrodes for controlling the interrupters of the different rows and the respective electrodes for controlling the interrupters of the different columns may be interconnected similarly to what has been described in relation with FIG. 4.

Figure 7:
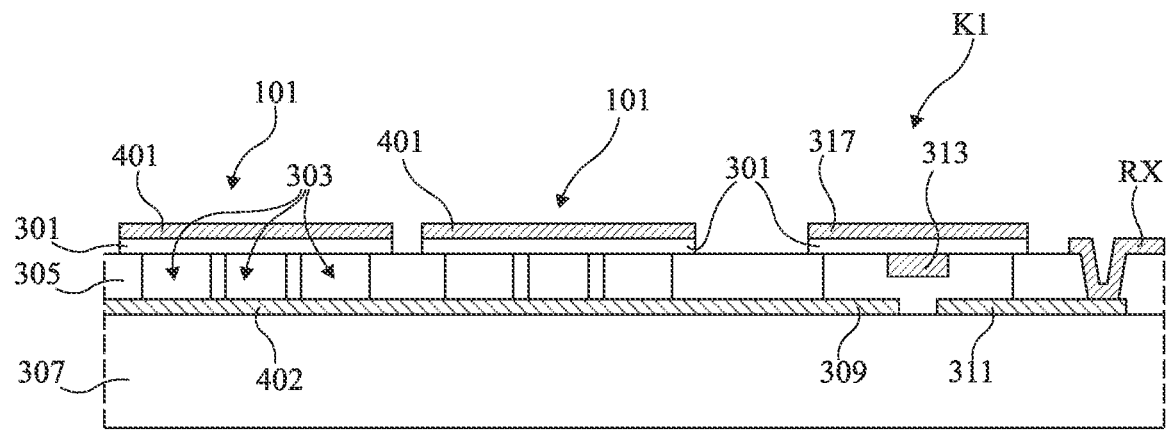
FIG. 7 is a partial simplified cross-section view of the device of FIG. 4.
Figure 7:
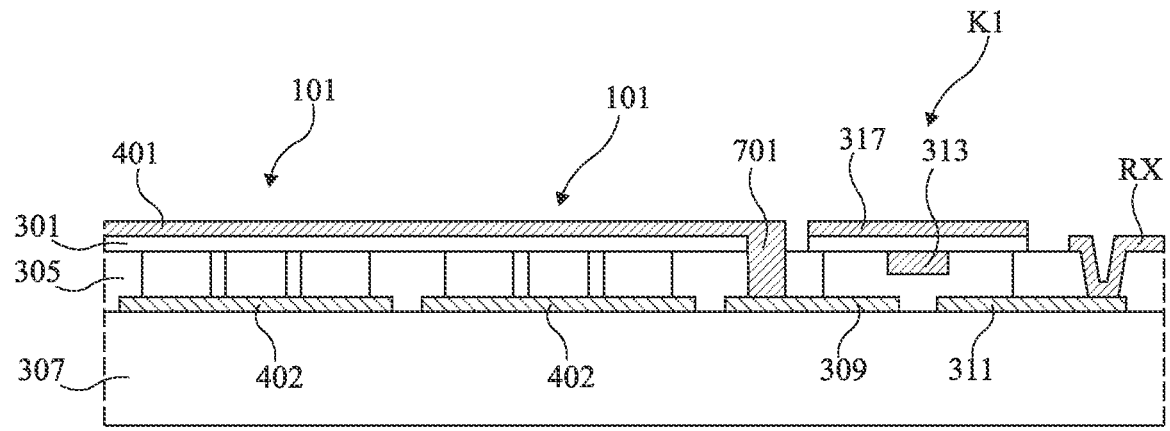

FIG. 7 schematically and partially illustrates an example of embodiment of the device of FIG. 4. FIG. 7 more particularly comprises a view (A) showing a longitudinal cross-section in the direction of a metal strip 402 of the device, and a view (B) showing a longitudinal cross-section in the direction of the metal strip 401 of the device. For simplification, in each view, only two transducers 101 and one interrupter K1 located at an end of the corresponding metal strip 401 or 402 have been shown.

As shown in FIG. 7, transducers 101 and the interrupters are formed on a same support substrate 307. Metal strips 402, the conduction electrodes 309 and 311 of the interrupters, as well as the lower control electrodes 315 of the interrupters (not shown in FIG. 7), are formed in a same first metallization level coating the upper surface of substrate 307. Support layer 305 is formed above the first metallization level. Membrane 301 is located above support layer 305. Metal strips 401 and the upper control electrodes 317 of the interrupters are formed in a same metallization level arranged above membrane 301. Each metal strip 401 is connected to the conduction terminal 309 of the interrupters of the switch SW of the corresponding row via conductive vias 701 crossing membrane layer 301 and support layer 305. Connection pads RX and TX (not visible in FIG. 7) may be formed in the same metallization level as metal strips 401.

It should be noted that in the example shown in FIG. 7, in each transducer 101, the cavity 303 above which membrane 301 is suspended is divided into a plurality of elementary cavities, for example, in an array of 3*3 elementary cavities separated two by two by walls made of the material of layer 305. The described embodiments are however not limited to this specific case.

Various embodiments and variants have been described. Those skilled in the art will understand that certain features of these various embodiments and variants may be combined, and other variants will occur to those skilled in the art. In particular, although only examples of embodiment where ultrasound transducers 101 are CMUT transducers have been described, the embodiments described in relation with FIGS. 1 and 2 may be adapted to any other type of transducer requiring being biased to a DC voltage on transmission and/or reception of ultrasound waves, for example PMUT-type ("Piezoelectric Micromachined Ultrasonic Transducer") transducers.

The invention claimed is:

1. An ultrasound imaging device, comprising:
a plurality of ultrasound transducers arranged in an array of rows and columns, each transducer comprising a first electrode and a second electrode, the first electrodes of the transducers of a same row being interconnected and the second electrodes of the transducers of a same column being interconnected;
for each row, a transmit circuit, a receive circuit, and a switch controllable to, in a first configuration, connect the first electrodes of the transducers in the row to the transmit circuit of the row and, in a second configuration, connect the first electrodes of the transducers in the row to the receive circuit of the row;
for each column, a transmit circuit, a receive circuit, and a switch controllable to, in a first configuration, connect the second electrodes of the transducers in the column to the transmit circuit of the column, and, in a second configuration, connect the second electrodes of the transducers in the column to the receive circuit of the column; and
a control circuit configured to:
during a first transmit phase, control the switches of a row and of a column into the first configuration, control the transmit circuit of the column to apply a DC bias signal on the first electrodes of the transducers in the row, and control the transmit circuit of the column to apply a variable excitation signal on the second electrodes of the transducers in the column; and/or
during a first receive phase, control the switches of a row and of a column respectively into the first configuration and into the second configuration, control the transmit circuit of the row to apply a DC bias signal on the first electrodes of the transducers in the row, and control the receive circuit of the column to read a variable response signal from the second electrodes of the transducers in the row.

2. The device according to claim 1, wherein the control circuit is further configured to:
during a second transmit phase, control the switches of a row and of a column into the first configuration, control the transmit circuit of the column to apply a DC bias signal on the second electrodes of the transducers in the column, and control the transmit circuit of the row to apply a variable excitation signal on the first electrodes of the transducers in the row; and/or
during a second receive phase, control the switches of a row and of a column respectively into the second configuration and into the first configuration, control the transmit circuit of the column to apply a DC bias signal on the second electrodes of the transducers in the column, and control the receive circuit of the column to read a variable response signal from the first electrodes of the transducers in the row.

3. The device according to claim 1, wherein:
in each row, the switch of the row is further controllable to, in a third configuration, connect the first electrodes of the transducers in the row to a node of application of a fixed bias potential; and
in each column, the switch of the column is further controllable to, in a third configuration, connect the second electrodes of the transducers in the column to said node of application of a fixed bias potential.

4. The device according to claim 1, wherein:
the switches of the different rows have common control terminals; and
the switches of the different columns have common control terminals.

5. The device according to claim 1, wherein:
the switches of the different rows have differentiated control terminals; and
the switches of the different columns have differentiated control terminals.

6. The device according to claim 1, wherein the ultrasound transducers are CMUT transducers or PMUT transducers.

7. The device according to claim 1, wherein the switches are monolithically co-integrated with the array of ultrasound transducers.

8. The device according to claim 7, wherein each switch comprises first and second electrostatically-controlled MEMS interrupters.

9. The device according to claim 8, wherein:
for each row, the first and second interrupters of the switch of the row are respectively arranged at the two ends of the row; and
for each column, the first and second interrupters of the switch of the column are respectively arranged at the two ends of the column.

10. The device according to claim 8, wherein:
for each row, the first and second interrupters of the switch of the row are arranged on the side of a same end of the row; and for each column, the first and second interrupters of the switch of the column are arranged on the side of a same end of the column.

11. The device according to claim 8, wherein each switch further comprises a third electrostatically-controlled MEMS interrupter, and wherein:
for each row, the third interrupter of the switch of the row is arranged on the side of the same end of the row as the first interrupter in the row, or on the side of the end of the row opposite to the first interrupter in the row;
for each column, the third interrupter of the switch of the column is arranged on the side of the same end of the column as the first interrupter in the column, or on the side of the end of the column opposite to the first interrupter in the column.

* * * * *